United States Patent

Pecone et al.

[11] Patent Number: 5,640,527
[45] Date of Patent: Jun. 17, 1997

[54] APPARATUS AND METHOD FOR ADDRESS PIPELINING OF DYNAMIC RANDOM ACCESS MEMORY UTILIZING TRANSPARENT PAGE ADDRESS LATCHES TO REDUCE WAIT STATES

[75] Inventors: Victor Pecone; Joseph A. Vivio, both of Austin, Tex.

[73] Assignee: Dell USA, L.P., Austin, Tex.

[21] Appl. No.: 521,259

[22] Filed: Aug. 30, 1995

Related U.S. Application Data

[63] Continuation of Ser. No. 92,302, Jul. 14, 1993, abandoned.
[51] Int. Cl.[6] .............................. G06F 12/00; G11C 8/00; G11C 11/408
[52] U.S. Cl. ....................... 395/405; 395/432; 395/496; 395/419; 395/421.01; 365/230.02; 365/230.08
[58] Field of Search ......................... 395/405, 431, 395/432, 484, 494, 495, 496, 412, 416, 418, 419, 421.01, 421.07, 421.08, 250, 550; 365/238.5, 230.02, 230.08

[56] References Cited

U.S. PATENT DOCUMENTS

| | | | |
|---|---|---|---|
| 4,750,839 | 6/1988 | Wang et al. | 365/238.5 |
| 4,805,098 | 2/1989 | Mills, Jr. et al. | 395/250 |
| 5,034,917 | 7/1991 | Bland et al. | 395/494 |
| 5,274,786 | 12/1993 | Diehl | 395/421.08 |
| 5,289,584 | 2/1994 | Thome et al. | 395/436 |
| 5,301,292 | 4/1994 | Hilton et al. | 395/484 |
| 5,303,364 | 4/1994 | Mayer et al. | 395/467 |
| 5,345,573 | 9/1994 | Bouden, III et al. | 395/405 |
| 5,479,635 | 12/1995 | Kametani | 395/419 |

*Primary Examiner*—Glenn Gossage
*Attorney, Agent, or Firm*—Haynes and Boone, L.L.P.

[57] ABSTRACT

An apparatus and method for address pipelining of a computer system that reduce the average number of wait states required to access a dynamic random access memory (DRAM) subsystem. A memory controller addresses a plurality of random access memory integrated circuits in pages of addresses wherein contiguous address pages are in different ones of the plurality of dynamic random access memory integrated circuits. Transparent latches associated with each of the different ones of the plurality of dynamic random access memory integrated circuits allow pipelining of address setups for more than one memory page at substantially the same time. The apparatus and method improve the write access times of a computer system and, when used with a computer system having address pipelining, both read and write accesses are improved because address set up latency time is reduced.

7 Claims, 3 Drawing Sheets

APPARATUS AND METHOD FOR ADDRESS PIPELINING OF DYNAMIC RANDOM ACCESS MEMORY UTILIZING TRANSPARENT PAGE ADDRESS LATCHES TO REDUCE WAIT STATES

This is a continuation of application Ser. No. 08/092,302, filed on Jul. 14, 1993, now abandoned.

BACKGROUND OF THE INVENTION

1. Field of the Invention

This invention relates generally to computers, and in particular, to systems utilized in computers to access dynamic random access memory (DRAM).

2. Description of the Related Technology

Personal computers are becoming more prevalent in the work place with more and more people depending on their livelihoods from the use thereof. Advances in computer technology have created the ability and thus the demand for increased memory capacity, faster program computation, higher display resolution and faster presentation of information to the computer user. This demand for computers may be directly attributable to the high speed operation of present microprocessors and the availability of megabytes of system memory.

Low cost system memory is made possible by the use of high density transistor memory consisting of dynamic random access memory ("DRAM") integrated circuits having millions of transistors and capable of storing megabytes of information. Fast and high capacity DRAM has substantially improved the speed of operation, ease of use, and data storage capacity of a personal computer.

Each personal computer system typically uses at least one megabyte of system memory and typically, four or more megabytes. Presently, DRAMs are manufactured in one, four and sixteen megabit capacities, while the future promises capacities of 64 megabits for integrated circuit DRAMs. There is a unique address for each individual piece of information stored in the DRAM. Address selection is accomplished by using binary numbers which are represented by either a "0" or a "1" and have values of $$\sum_{i=1}^{n} 2^{n-i},$$

where n is the number of binary digits and n=20 for a one megabit binary number. Thus, a 20 digit binary number is required to represent a unique address for a one bit wide memory cell in a one megabit storage capacity DRAM. One megabit DRAMs may also be configured as 4 bits by 256K (where K=1024), which requires an 18 digit binary number for address selection.

A DRAM integrated circuit, therefore, must have a sufficient number of connections ("pins") to accept the address for one of its memory cell locations. As mentioned previously, one megabit in the binary number system requires 20 binary digits or, in terms of electrical connections, requires 20 pins on a one megabit DRAM integrated circuit. In addition, the DRAM requires other control signals and, of course, the data input and output connections; thus, in large capacity DRAMs a problem exists in the number of connections that must be placed physically on the DRAM integrated circuit.

The greater the number of pins that are required on an integrated circuit, the larger the physical package must be. Size is a major factor in cost and utilization in high density printed circuit boards. The semiconductor and computer industries have compromised in the manufacture and use of DRAM integrated circuits by optimizing size and price with data access speed. Multiplexing the address pins greatly reduces the size and cost of DRAM integrated circuits.

To multiplex DRAM address pins, the DRAM integrated circuit is designed with its addressing configured into a two dimensional X-Y matrix with the X axis called "rows" and the Y axis called "columns". Normally, the lower order binary address digits or "address bits" are represented by the columns and the higher order binary address digits by the rows. Therefore, when addressing a DRAM address, the row address bits may first be presented on the DRAM address pins, stored into the internal DRAM logic by a row address control signal, and then the remaining column address bits may next be presented on the same DRAM address pins to complete the entire binary memory address.

DRAM integrated circuits are slower in operation, however, than the microprocessor, therefore the computer system typically must wait a certain amount of time for each DRAM access operation. A typical DRAM memory controller introduces "wait states" into a DRAM memory access request from the microprocessor or other bus master of the computer system. The memory access cycle is delayed by these wait states for both row and column address selection of the DRAM and comprise the majority of the time required for the access cycle.

In a computer system, a plurality of DRAM integrated circuits may be arranged into common row and column addresses to provide the required data word width, for example, in eight bit bytes and 16 or 32 bit words. As those of ordinary skill in the art will readily appreciate, in order to provide the data word size required, DRAMs must be arranged with the same, or common, row and column address such that for each address generated, each DRAM will deliver its portion of the data word associated with that address. A plurality of contiguously addressed bytes may be further grouped together as, for example, 64 kilobytes and will be referred to hereinafter as "pages" of memory. There is a unique row address for each of these pages of memory. Each page of memory utilizes the column address lines to select the unique binary address of an individual byte within the page. Within a page of memory, the least significant bits of the column address are utilized for rapid multiple data transfers between the memory and the computer system central processing unit ("CPU"). Rapid transfer of data located in multiple memory locations may be called "page mode" or "burst transfer" of the data.

Normally, within a page of memory, the row address is selected once and not changed by the memory controller logic while the column addresses select the desired memory locations within the selected memory page. A problem exists, however, when a new page of memory must be addressed. A new page of memory requires a new row address which requires that the new row address be placed on the DRAM integrated circuit address pins and asserted into the DRAM internal address multiplexing storage register by a row address strobe ("RAS") signal. The column address must then be placed on the DRAM integrated circuit address pins and asserted into the DRAM by a column address strobe ("CAS") signal for selection of the desired memory location.

Having to select the row address before selecting the column address, because of the multiplexing requirements of the DRAM, creates the need to generate a number of wait states by the DRAM controller logic. What is needed is a way to reduce the number of wait states required during DRAM access operations by the computer system.

SUMMARY OF THE INVENTION

In contrast to prior methods and systems for controlling access to computer random access memory, the system and method of the present invention reduces the number of computer system wait states required by pipelining the row addressing of the DRAM system with a previous column address. Pipelining is the substantially simultaneous occurrence of two or more actions that would normally happen sequentially. The present invention achieves this reduction in the number of wait states by storing column addresses in address latches that also serve as both row and column address buffers to the DRAMs.

It is therefore an object of the present invention to reduce the number of wait states during a memory access by pipelining the selection of the DRAM addresses. The present invention accomplishes this object by utilizing transparent latches that can both buffer and store row and column addresses.

In one embodiment, the present invention consists of a DRAM controller application specific integrated circuit (ASIC) and discrete integrated circuit latches. These latches are utilized to store a column address for a first page of DRAM, then while the first page of DRAM is receiving its stored column address, the row address of a second page of DRAM may be simultaneously addressed.

In one aspect of the invention, the DRAM controller provides an interface between the system address, data and control buses, and the DRAM system. The DRAM controller provides the DRAM integrated circuits with row and column addresses and control signals interpreted from the computer system address and control bus signals.

In another aspect of the invention, the DRAM integrated circuits are arranged into groups. Each DRAM group has its own unique row address strobe ("RAS") signal and address bus. Typically, in DRAM systems, the address bus is buffered in order to handle the load requirements of the DRAM integrated circuits. In the system and method of the present invention, these address buffers are replaced with latches that are transparent to the computer system memory operation. The ASIC memory controller controls these address latches so as to minimize computer system wait states when accessing the DRAM memory.

The ASIC memory controller receives a first address from the computer system CPU. The controller maps this first address into a particular first page DRAM row address that passes through the latches which are open and provides only buffering for these row address signals. The controller strobes the first row address into the DRAM with a corresponding first page row address strobe (RAS) signal, then the controller asserts the first page DRAM column address and stores this column address in the latches of the present invention. The least significant address bits of the column address are not latched so that burst data transfer cycles may be performed.

The ASIC memory controller is now free to assert a second page DRAM row address while the first page DRAM column address is being processed by the first page DRAMs. The memory controller now asserts the second page DRAM row address through latches associated with the second page DRAMs. The second page row address passes through the associated second latches and is asserted into the second page of DRAMs with an associated second page RAS signal. The second column address is then asserted by the memory controller and stored in the second latches wherein the memory controller is free to set up a third address either to the first page, or a third page of memory, etc.

In another embodiment, the present invention may consist of a plurality of DRAM pages having unique row addresses and associated address latches. Contiguously addressed DRAM may consist of a plurality of different DRAM pages arranged into an interleaved pattern, where contiguously addressed pages are in different DRAM, so as to take advantage of small, for example, 16 kilobyte, DRAM pages. This small page size allows more page misses to occur across separate DRAM groups, thus taking better advantage of address pipelining, reduced access latency and improved memory system performance.

An advantage of the present invention is that it may also be utilized with computer systems not having address pipelining capabilities. The write cycles of a non-pipelined address computer system may have the associated wait states reduced as mentioned above. Read cycles of a non-pipelined address computer system would not normally be improved, however, because of the DRAM read access set up time.

A feature of the present invention is that it allows substantially simultaneous addressing of the column address of one memory page and the row address of a different memory page. Thus, pipelined addressing greatly benefits the speed in which the computer system accesses the DRAM. By having a plurality of independent DRAM pages with associated latches, a DRAM system may be fabricated using normal speed DRAMs but having greatly improved data transfer speed. This is especially important for multiprocessor based computer systems that must arbitrate for access to the DRAM system.

In another aspect of the invention, write buffers for write queuing of the memory system may be utilized. Write queuing effectively pipelines the computer system bus before a memory cycle has completed. This is especially advantageous for burst data transfers in both non-pipelined and pipelined address computer systems.

Other and further objects, features and advantages will be apparent from the following description of the preferred embodiment of the invention, given for the purpose of disclosure and taken in conjunction with the accompanying drawings.

DETAILED DESCRIPTION OF A PREFERRED EMBODIMENT

Computer System

Figure 1:
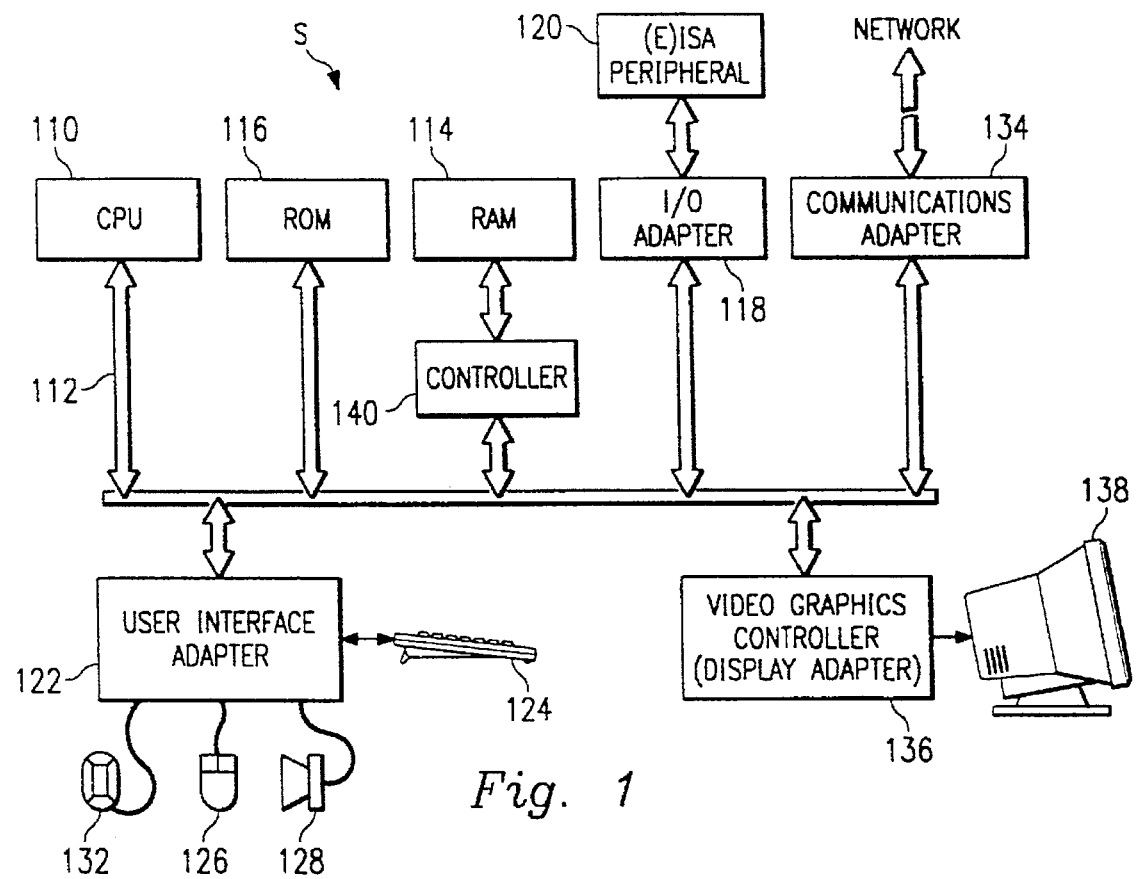
FIG. 1 is a block diagram of a computer system utilizing the present invention.

Referring now to the drawings, the details of a preferred embodiment are schematically illustrated. In the drawings the letter S designates generally a computer system. FIG. 1 illustrates a suitable hardware configuration of a computer system S in accordance with the present invention. The computer system S has a central processing unit 110, such as a conventional microprocessor, and a number of other devices interconnected via a computer system bus 112. The computer system S comprises a random access memory (RAM) 114, a memory controller 140, a read only memory (ROM) 116, an input/output (I/O) adapter 118 for connecting industry standard architecture (ISA) or extended industry standard architecture (EISA) peripherals 120, a user interface adapter 122 for connecting a keyboard 124, a mouse 126, a speaker 128, a microphone 132, a communications adapter 134, and a video graphics controller 136 adapted for driving a video display 138. Computer system S shows all components directly connected to the CPU 110 via the system bus 112. However, it should be understood that slower devices, such as the ROM 116, the communications adapter 134 and the user interface adapter 122 may be attached to a slower ISA bus.

Operation of a Preferred Embodiment

Figure 2:
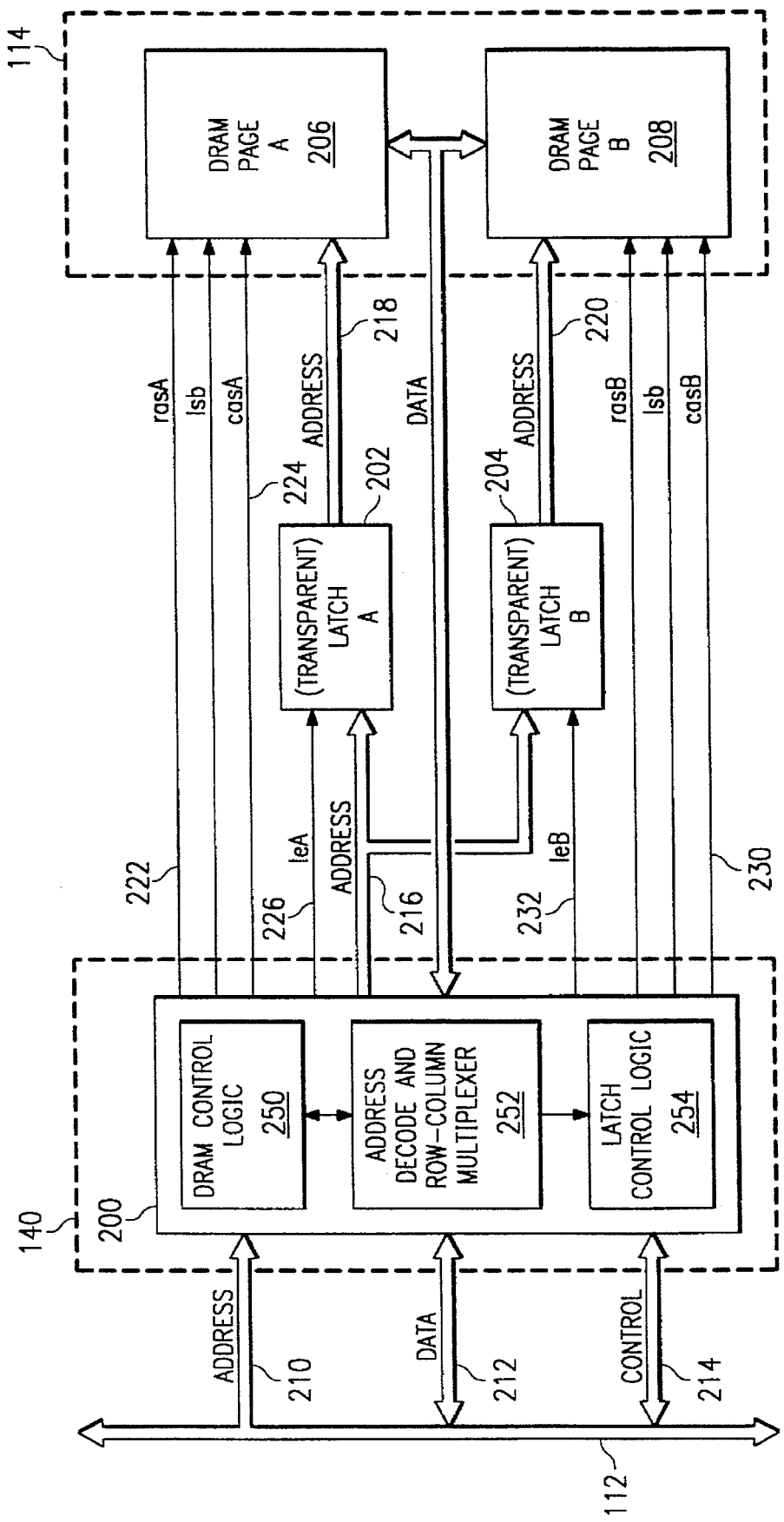
FIG. 2 is a block diagram of a preferred embodiment of an apparatus for address pipelining of dynamic random access memory according to the present invention.

Referring now to FIG. 2, a block diagram of a preferred embodiment of the present invention is illustrated. The memory controller/interface 140 (FIG. 1) consists of an ASIC DRAM memory controller 200 and a plurality of address latches, for example, latches 202 and 204. The address latches may be digital integrated circuit storage registers. The RAM 114 comprises a plurality of DRAMs, for example, DRAM blocks 206 and 208.

The memory controller 200 consists of logic circuits that decode and direct addresses in the proper row/column address format to the appropriate DRAM block 206 or 208. In addition, the controller 200 controls the latches 202 and 204 at the appropriate column selection times. The controller 200 may consist of DRAM memory control logic 250, address decode and row/column multiplexer logic 252 and latch control logic 254.

The DRAM control logic 250 receives and decodes incoming address and control signals from the computer system bus 112 and generates the appropriate response signals thereto. The address decode and row/column multiplexer logic 252 splits the incoming address from the busses 112 into the appropriate row and column addresses for multiplexed addressing of the respective DRAM block 206 or 208 and strobe control thereof.

The latch control logic 254 enables or disables the latching functions of latches 202 and 204. The latch 202 or 204 will latch and hold a column address of a first page of DRAM while another latch will act as a transparent latch or buffer only and allow a row address of a second page of DRAM to pass therethrough without latching thereof. In this way, column addressing of the first page and row addressing of the second page are pipelined together.

One skilled in the art of digital logic and memory control circuits could readily design appropriate DRAM and latch control logic using ASIC or other digital logic devices well known in the art.

For exemplary purposes, the DRAM blocks 206 and 208 and the latches 202 and 204 will be illustrated as two pages of DRAM with associated latches and referred to as "A" and "B", respectively. One skilled in the art of memory systems, however, will readily appreciate that the system and method of the present invention may utilize any number of DRAM pages with associated latches and an appropriate memory controller. The memory controller may be fabricated using any type of logic technology and is not limited to ASIC devices only.

The DRAM memory controller 200 receives address signals from the computer system S on address bus 210. Data bus 212 and control bus 214 are bidirectional. The data bus 212 sends data signals to the DRAM memory controller 200 during a memory write operation and receives signals from the DRAM memory controller 200 during a memory read operation. The control bus 214 sends control signals back and forth between the computer system S and the DRAM memory controller 200. Upon receiving the computer system address signals from the address bus 210, the DRAM memory controller 200 maps the received computer system address into the row address of the intended DRAM page. This row address is sent to the inputs of latches 202 and 204 on controller address bus 216.

Initially, both latches 202 and 204 are open (i.e., transparent) allowing the row address of the selected DRAM page to pass therethrough. When a DRAM page is selected, for example DRAM page A, the row address strobe A (RASA) 222 causes the DRAM page A to store the asserted row address. Next, the upper bits of the column address of the selected DRAM locations are asserted on the controller address bus 216 by the DRAM memory controller 200. Latch 202 stores the column address when the latch enable A (LEA) 226 is de-asserted by the DRAM memory controller 200.

As soon as the latch 202 stores the column address for DRAM page A, the DRAM memory controller 200 is free to assert the row address of the next selected DRAM page. If this row address is for DRAM page A, then the DRAM memory controller 200 must wait until the entire memory cycle associated with DRAM page A is completed before accessing the DRAM page A at another page row address. Thus, accessing the same DRAM page requires waiting for the entire memory cycle of that DRAM page to finish. If, however, the row address of the next selected DRAM page is for DRAM page B, then the DRAM memory controller 200 may assert this row address on controller address bus 216 because latch 202 is holding the presently utilized column address for the DRAM page A memory cycle. The column address information held by latch 202 is applied to DRAM page A on bus 218 and asserted into the DRAM page A by the column address strobe A (CASA) 224.

Whenever the DRAM memory controller 200 addresses physically different DRAMs, the method and apparatus of the present invention allows pipelining of alternate page DRAM selection. Preferably, the DRAM memory controller 200 would alternately select DRAM pages A and B when row addressing between two contiguous memory page boundaries.

DRAM page B is addressed by the DRAM memory controller 200 in similar fashion as mentioned above. Latch 204 passes the row address signals to the DRAM page B and row address strobe B (RASB) 228 latches the row address information into DRAM page B. Next, the column address information is stored in the latch 204 by latch enable B (LEB) 232 from the DRAM memory controller 200. The column address information stored in latch 204 is applied to DRAM page B on bus 220 and asserted into the DRAM page B column address strobe B (CASB) 230.

Once the column address information is stored in the latch 204, the DRAM memory controller 200 may start yet another memory access to either DRAM page A or a third, fourth, fifth, etc. DRAM page. The column address information is loaded into the DRAM page B by CASB 230 at the appropriate time. The least significant column address bits are not latched so as to allow burst mode data transfers between the memory and computer system.

The embodiment of the present invention described herein is illustrated for a computer system utilizing an 80486 microprocessor from Intel Corporation (Santa Clara, Calif.). For exemplary purposes, the address and control signal designations referenced herein will be for the 80486 microprocessor functioning in the computer system as the central processing unit (CPU), unless otherwise specified. One skilled in the art of computer systems could readily utilize the present invention in other computer systems utilizing different microprocessor integrated circuits such as, for example, the R6000 from International Business Machines Corporation (Armonk, N.Y.), the 68040 from Motorola Corporation (Schaumburg, Ill.), or PENTIUM™ from Intel Corporation. Any computer system utilizing pipelining of addresses to memory may benefit from the present invention in both read and write cycles.

Referring now to the data book for the 80486 entitled "Intel Microprocessors, Volume I" (1992), incorporated herein by reference, the following control signals will be referred to in this disclosure:

Clock (CLK)—provides the fundamental timing for the Intel486 microprocessor.

Address Status Output (ADS)—indicates that the address and bus cycle definition signals are valid. This signal wilt go active in the first clock of a bus cycle, and go inactive in the second and subsequent clocks of the cycle.

Address—from the address bus and provides physical memory and I/O port addresses.

Burst Ready Input (BRDY)—indicates that the external system (memory) has presented valid data in response to a read or that the external system has accepted data in response to a write. The BRDY denotes that the external system (memory) is capable of performing a burst data transfer.

Figure 3:
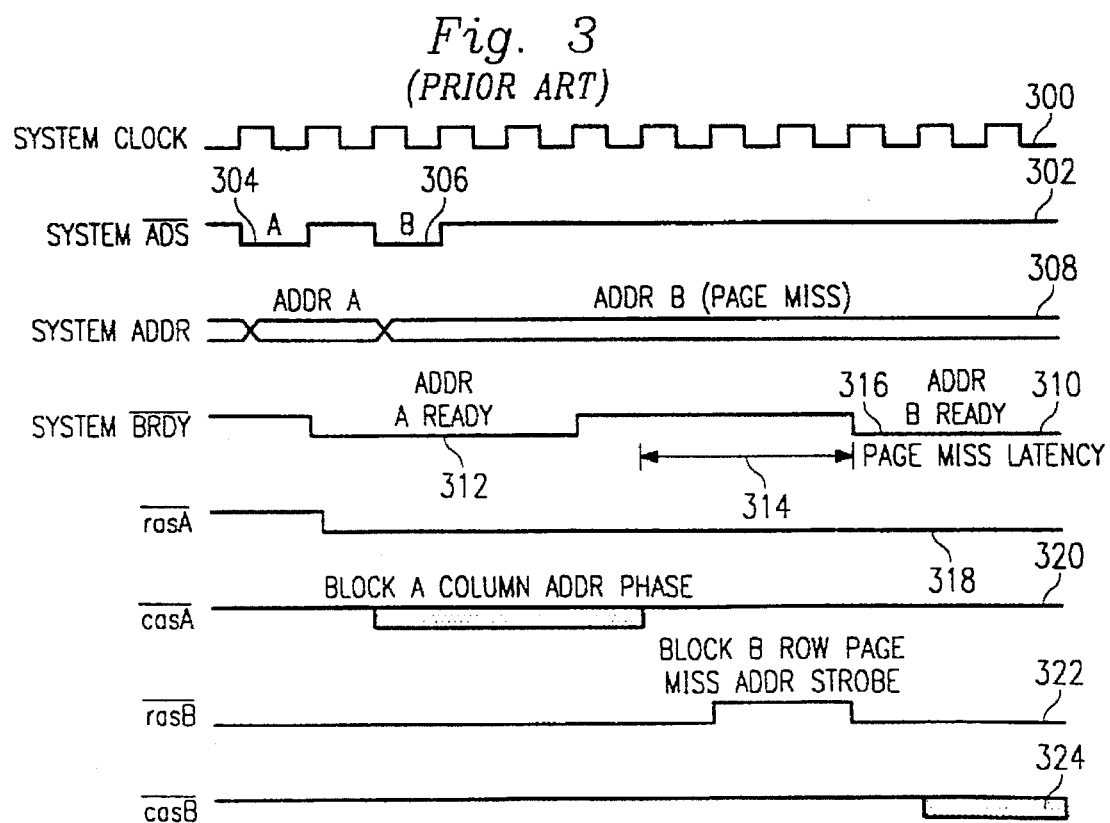
FIG. 3 is a timing diagram of signals associated with a personal computer system utilizing prior art memory controllers.

Referring now to FIG. 3, a timing diagram of a pipelined address computer system utilizing a microprocessor such as, for example, a PENTIUM and prior art memory control is illustrated. A system clock 300 is used for bus signal timing wherein system Address Status Output (ADS) 302 indicates when the Address 308 and the bus cycle definition signals (not illustrated) are valid. The Burst Ready (BRDY) 310 indicates when the memory system is ready to transfer data to the computer system.

Clock 300, ADS 302, Address 308 and BRDY 310 are signals between the computer system S and the DRAM memory controller 200. The DRAM memory controller 200 creates from the aforementioned signals RASA 318 and CASA 320, both for DRAM page A and RASB 322 and CASB 324, both for DRAM page B. ADS 302, being asserted at times 304 and 306, represent when a first address addrA and a second address addrB are valid.

For a non-latched column address, the timing of two different page address accesses requires a number of wait states, including the wait states, as indicated by time arrow 314. The reason for the wait states 314 is because each page of DRAM must be set up with both the row and column addresses before another page of DRAM may be accessed by the computer system S. When BRDY 310 is asserted during time 312, both the RASA 318 and CASA 320 have asserted the row and column memory addresses, respectively, into the DRAM page A. The next page address to DRAM page B must wait, i.e., wait states are required, until the DRAM page B has received both of its row and column addresses. This does not happen until both RASB 322 and CASB 324 strobe the next row and column memory addresses into the DRAM page B. BRDY 310 is asserted at time 316 for the DRAM page B.

The set up times for both pages of DRAM pages A and B happen sequentially without pipelining, thus requiring a number of wait states and ultimately slowing down memory accesses by the computer system S. The present invention allows the set up times for both pages of DRAM pages A and B to happen substantially at the same time or at contemporaneously overlapping times. This results in a reduction of the wait states generated by the memory controller.

Figure 4:
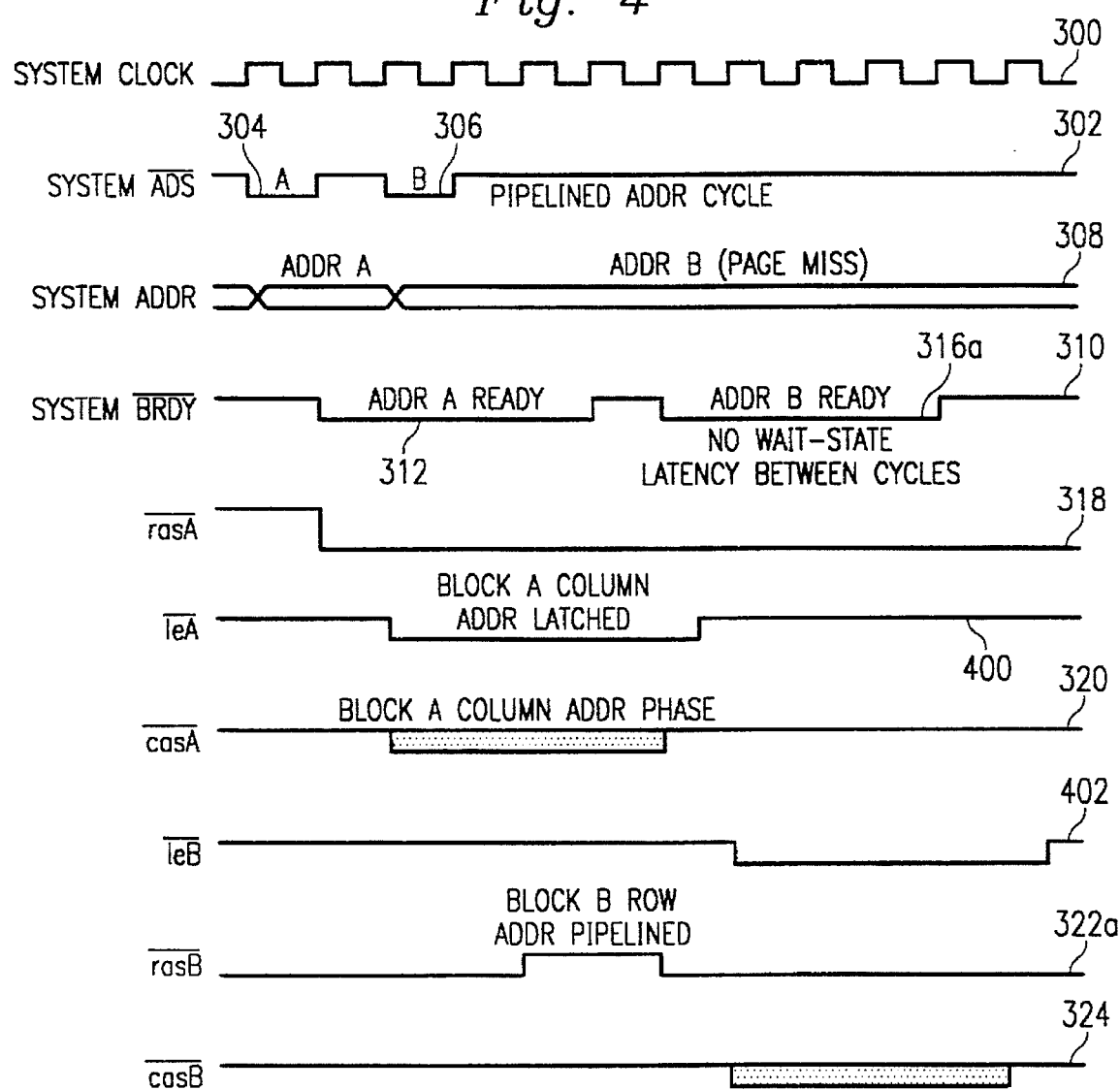
FIG. 4 is a timing diagram of signals associated with a personal computer system utilizing a preferred embodiment of an apparatus for address pipelining of dynamic random access memory according to the present invention.

Referring now to FIG. 4, a timing diagram of a pipelined address computer system utilizing the present invention is illustrated. Signal functions are the same or similar to those of FIG. 3 except for the following signals. The row address strobe (RASB) 322a for the DRAM page B memory page selection happens contemporaneously with the column address strobe (CASA) 320 of DRAM page A. This pipelining of the address signals, controlled by CASA 320 and RASB 322a, allows BRDY 310a to be asserted at time 316a. Also, because RASB 322a and BRDY 310a are asserted earlier, CASB 324a may also be asserted earlier, thus substantially reducing or eliminating the wait states.

One skilled in the art of computer systems can readily appreciate the time savings and increase in memory throughput by utilizing the system and method of the present invention for the millions and millions of memory accesses performed by a computer system during its operation.

A preferred embodiment of the present invention utilizing the 80486 or PENTIUM microprocessor has been described in some detail to enable one skilled in the art to replicate the method and apparatus of the present invention. The present invention allows writing to and reading from memory at a faster rate because of the ability to set up different pages of DRAM more efficiently by overlapping the required address set up times. Other and further types of CPUs and computer systems may benefit from the method and apparatus of the present invention, and would be readily apparent to those skilled in the art of computer systems design.

The system and method of the present invention, therefore, is well adapted to carry out the objects and attain the ends and advantages mentioned, as well as others inherent therein. While a presently preferred embodiment of the invention has been given for purposes of disclosure, numerous changes in the details of construction, interconnection and arrangement of parts will readily suggest themselves to those skilled in the art, and which are encompassed within the spirit of the invention and the scope of the appended claims.

What is claimed is:

1. An apparatus for controlling information transfer between a computer system and a random access memory arranged in separate, predefined pages, comprising:

a memory controller, said memory controller connected to address, data and control buses of the computer system, and to the random access memory, said memory controller addressing the predefined pages with row addresses and column addresses; and a plurality of storage registers, each associated with a single page, said storage registers connected between said memory controller and respective ones of said pages, for storing column addresses from said memory controller so that a stored column address associated with a first page and a row address associated with a second page, may be asserted at the same time.

2. An apparatus for pipelining addresses in a computer system having a page mode random access memory system comprising:

a plurality of random access memory integrated circuits (ICs), wherein each memory IC contains one or more addressable pages, each page having a unique address and contiguously addressed pages being located in different memory ICs;

a plurality of latches, wherein each latch is connected to a different one of said memory ICs for buffering and storing addresses for that IC;

a memory controller connected to said computer system, said latches and said memory ICs, wherein said memory controller decodes addresses received from said computer system into row and column addresses for accessing said random access memory ICs, wherein said memory controller latches a column address corresponding to a first page in a first latch for addressing a first memory IC associated with said first page, and while said column address corresponding to said first page is latched, said memory controller asserts a row address corresponding to a second page for addressing a second memory IC associated with said second page.

3. The apparatus of claim 2, wherein said memory controller comprises an application specific integrated circuit (ASIC).

4. The apparatus of claim 2, wherein said random access memory integrated circuits are dynamic random access memories.

5. In a computer system comprising a processing unit and a plurality of random access memory (RAM) integrated circuits arranged in two or more predefined pages, wherein different ones of said plurality of random access memory integrated circuits comprise each page, a memory controller for pipelining consecutive addresses from said processing unit for accessing said random access memory integrated circuits, said controller composing:

logic circuits for decoding said addresses from said processing unit into row and column addresses for selection of specific memory locations in the pages of said random access memory integrated circuits and for directing said row addresses and said column addresses to said pages;

a plurality of address latches connected between said logic circuits and the plurality of pages, one latch for each page;

means for controlling said plurality of address latches such that after a first address is received by said means for controlling, a first latch of said address latches stores a column address associated with the first address to select a specific location in a first page while a row address associated with a second address is asserted to select a specific location in a second page.

6. A method for pipelining page mode addressing of random access memory (RAM), comprised of a plurality of random access memory integrated circuits, in a computer system, said method comprising the steps of:

receiving a plurality of addresses from the computer system;

decoding the plurality of addresses into row and column addresses for selection of memory locations from the plurality of random access memory integrated circuits;

directing a first row address into a first of the plurality of random access memory integrated circuits associated with said first row address;

storing a first column address in a plurality of address latches; and directing the first stored column address into the first of the plurality of random access memory integrated circuits, wherein corresponding memory locations of said plurality of random access memory integrated circuits are accessed, while at the same time, directing a second row address to a second of the plurality of random access memory integrated circuits, associated with said second row address, different from the first of the plurality of random access memory integrated circuits.

7. In a computer system, a method for pipelining addresses to a random access memory system comprising a plurality of random access memory circuits, the method comprising the steps of:

arranging said memory circuits into separately addressable pages;

receiving a first address within said memory system from said computer system;

decoding said first address into first row and column addresses;

directing the first row address to a first memory circuit associated with a first page;

latching the first column address;

directing the latched first column address to said first memory circuit and at the same time;

receiving a second address from said computer system, decoding said second address into second row and column addresses, directing said second row address to a second memory circuit associated with a second page different from said first page.

\* \* \* \* \*